(12) United States Patent
Datta et al.

(10) Patent No.: US 8,030,982 B2
(45) Date of Patent: Oct. 4, 2011

(54) SYSTEMS AND METHODS USING IMPROVED CLOCK GATING CELLS

(75) Inventors: Animesh Datta, San Diego, CA (US); Martin Saint-Laurent, Austin, TX (US); Varun Verma, San Diego, CA (US); Prayag B. Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 45 days.

(21) Appl. No.: 12/261,428

(22) Filed: Oct. 30, 2008

(65) Prior Publication Data

US 2010/0109747 A1    May 6, 2010

(51) Int. Cl.
*G06F 1/04*    (2006.01)
(52) U.S. Cl. .......................................... 327/291; 327/211
(58) Field of Classification Search .......................... None
See application file for complete search history.

(56) References Cited

U.S. PATENT DOCUMENTS

| 5,883,529 | A | 3/1999 | Kumata et al. |
| 6,023,179 | A * | 2/2000 | Klass ............................ 327/211 |
| 6,741,100 | B2 * | 5/2004 | Itaka et al. ...................... 326/93 |
| 2008/0092103 | A1 * | 4/2008 | Aoyama .......................... 716/18 |

FOREIGN PATENT DOCUMENTS

GB    2420034    5/2006

OTHER PUBLICATIONS

International Search Report and Written Opinion—PCT/US2009/062489, ISA/EPO—Jan. 22, 2010.

\* cited by examiner

*Primary Examiner* — Cassandra Cox
(74) *Attorney, Agent, or Firm* — Sam Talpalatsky; Nicholas J. Pauley; Jonathan T. Velasco (57) ABSTRACT

A clock gating cell that comprises a latch in communication with an input enable logic and an output logic circuit, wherein the latch includes a pull-up and/or a pull-down circuit at an input node of the output logic circuit and circuitry preventing premature charge or discharge of the output logic circuit input node by the pull-up and/or the pull-down circuit when the clock gating cell is enabled.

23 Claims, 11 Drawing Sheets

FIG. 1

PRIOR ART

FIG. 2

PRIOR ART

FIG. 3

PRIOR ART

FIG. 4

PRIOR ART

SYSTEMS AND METHODS USING IMPROVED CLOCK GATING CELLS

TECHNICAL FIELD

The present description generally relates to clock gating cells and, more specifically, to clock gating cells with improved ability to handle slow-rising or slow-falling clock edges.

BACKGROUND

Figure 1:
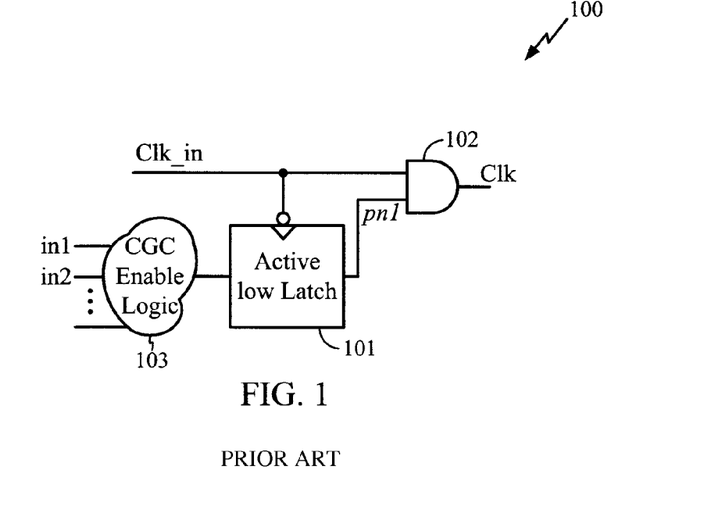
FIG. 1 is an illustration of a conventional clock gating cell.

FIG. 1 is an illustration of a conventional clock gating cell (CGC) 100. CGCs are used in many applications to stop the propagation of a clock signal to an unused circuit to reduce the dynamic power by halting computation in the circuit. For instance, in a handheld device that includes MP3 functionality and phone functionality, when a user is playing an MP3 file but not using the phone, one or more CGCs can be used to prevent the clock from propagating to parts of the processor (as well as to other chips) that are not used when the phone functionality is idle. Parts that do not receive the clock use much less power, so that battery life is extended. Furthermore, the un-gated clock signal itself has a high activity factor, making it a major source of dynamic power usage.

The CGC 100 has a clock input and enable inputs. The global clock source is the clock input, and it is labeled Clk_in. A CGC, such as CGC 100, can include any number of enable inputs, examples of which can include a clock enable (Clk_en), and a scan enable (test_en) that activates the clock during scan testing of the circuit. FIG. 1 shows the generic block diagram of a typical CGC standard cell circuit that includes an active low latch 101, a two-input AND gate 102, and enable logic 103. The output of the CGC 100 is Clk, which is the gated clock pulse.

Figure 2:
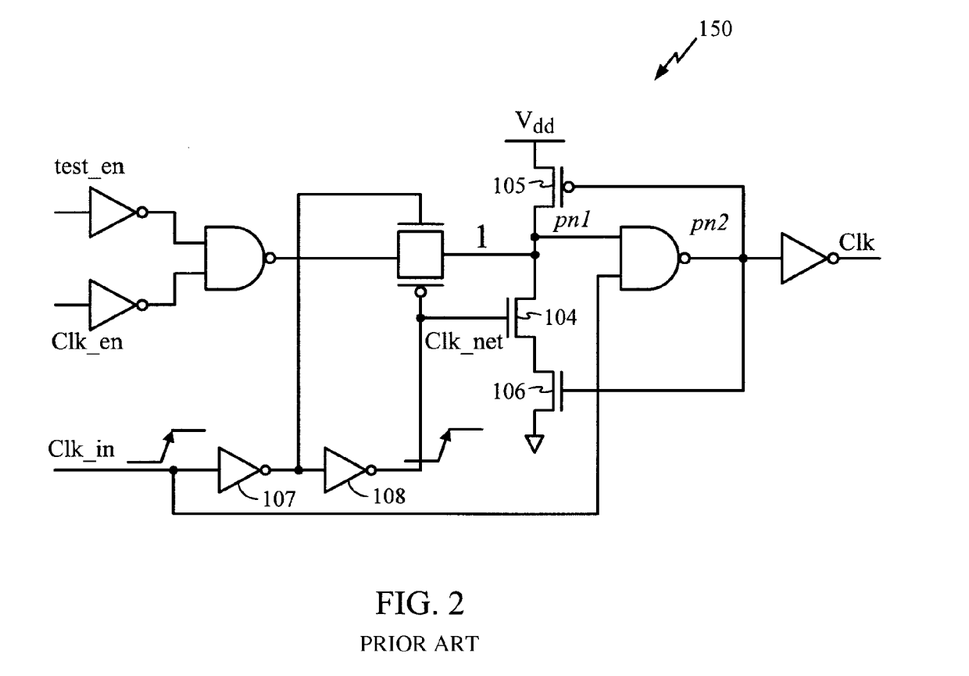
FIG. 2 is an illustration of a more detailed view of the CGC of FIG. 1.
Figure 3:
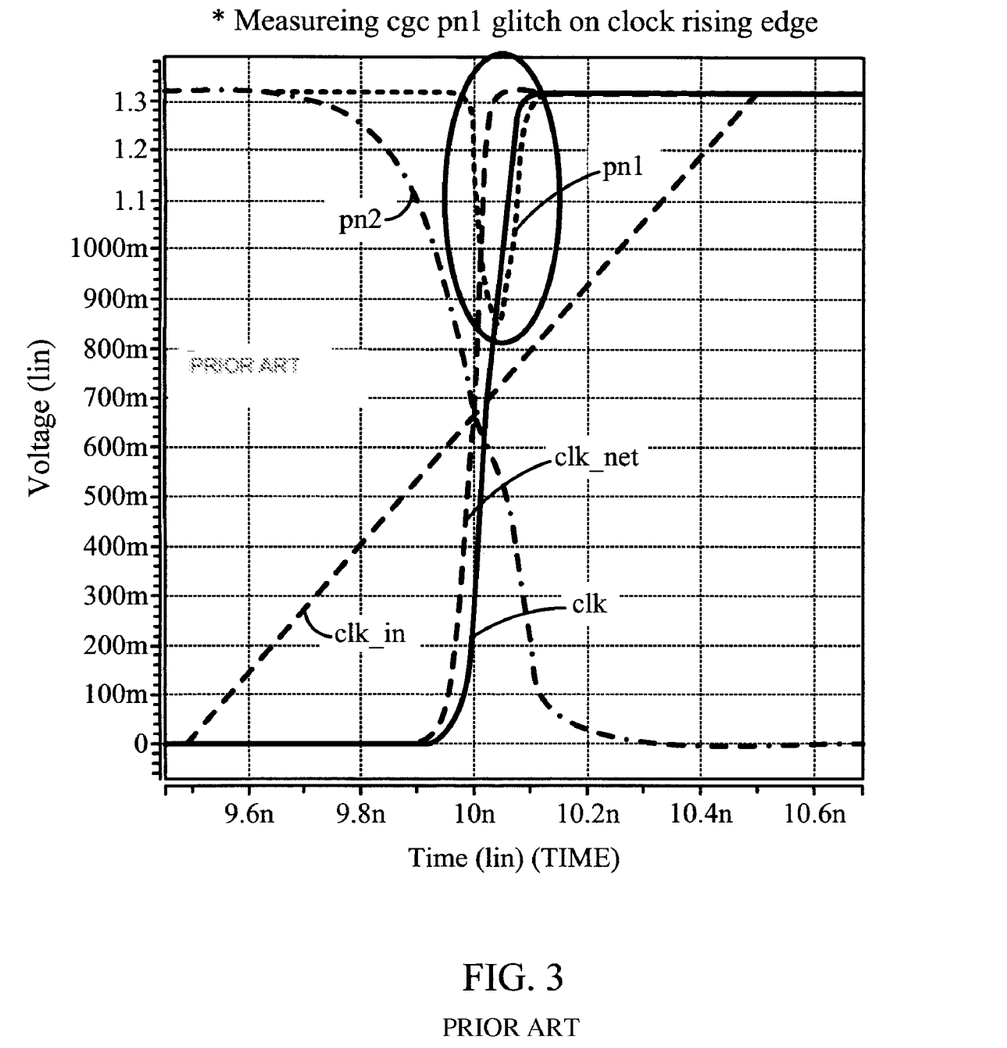
FIG. 3 illustrates a simulated timing diagram of key nodes of the CGC of FIG. 1 during a particular mode of operation.

At lower voltages, the edge rate of Clk_in can become significantly degraded and eventually lead to functional failure in the CGC 100. FIG. 2 is an illustration of a more detailed view of a CGC 150 configured according to design of the CGC 100, and FIG. 3 illustrates a timing diagram of key nodes of the CGC 150 during some operations. FIG. 3 shows that the active low latch 101 includes, among other things, an inverter chain (i.e., the inverters 107 and 108) and a pull-down stack (i.e., the NMOS transistors 104 and 106). When the active low latch 101 is enabled (either from test_en or Clk_en signal) initially the pn1 node is set to logic 1 during the transparent phase of the latch 101. Under this condition the CGC 150 passes the input Clk_in signal to the output Clk. Initially the Clk_in is at logic 0, so the pn2 node is at logic 1. For a slow rising input Clk_in signal, the voltage at the internally buffered Clk_net node can rise quickly, even before Clk_in rises halfway to Vdd/2 (where Vdd is system power), thereby turning on the pull-down NFET 104 (FIG. 2) of the pn1 node. This is undesirable. It creates a race condition and provides a discharging path for the pn1 node until the input Clk_in signal is propagated to the output and shuts off the feedback pull-down NFET 105. As shown in FIG. 3, the pn1 node voltage can drop momentarily before being restored to logic 1. The drop in voltage at the pn1 node leads to functional failures at low voltage operation of the chip.

Figure 4:
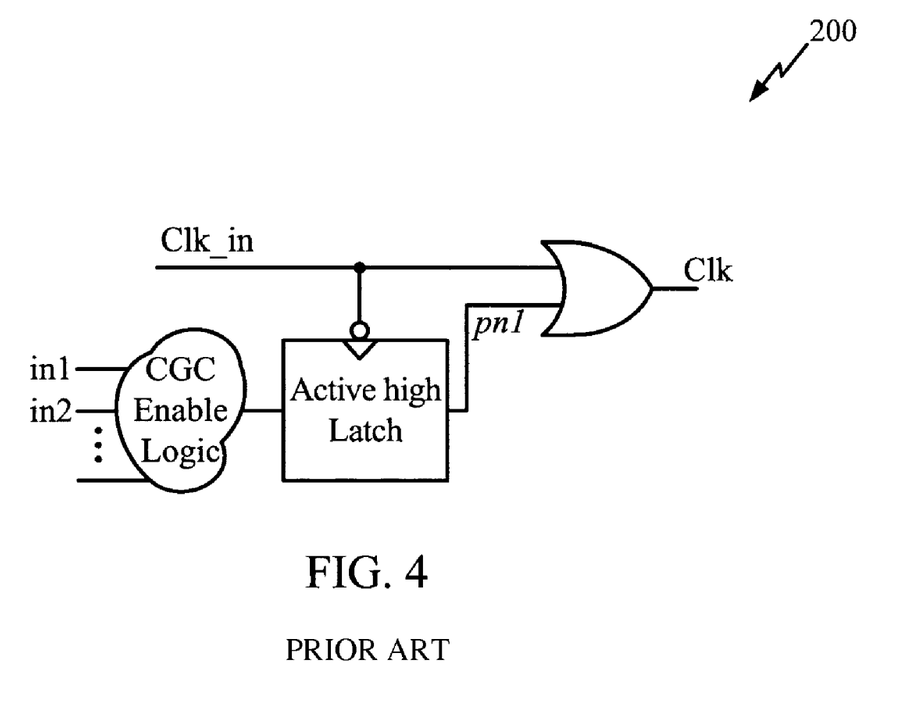
FIG. 4 is an illustration of a conventional CGC which employs an active high latch and an OR gate at the output.

CGCs are not limited to using active low latches. For instance, FIG. 4 is an illustration of a conventional CGC 400 which employs an active high latch and an OR gate at the output. CGC 400 is, essentially, a dual of CGC 100. Potential functional failures can occur during slower Clk_in transitions in the active high-latch based CGC 200 of FIG. 400 when premature charging of the pn1 node occurs (as opposed to the premature discharging issue of CGC 100 of FIG. 1).

Prior art solutions to guard against the functional failure described above include over-designing the clock tree to maintain a good edge rate during low voltage operations or slower lots of the manufactured parts. However, over-designing the clock tree comes at a cost of burning more dynamic power and shorter battery life. Another solution is to upsize a CGC's output logic to quickly propagate the input clock signal to the output node. This approach is conventionally followed in the industry for general purpose clock gating, but it comes at a cost of increasing the area needed for the output logic, burning more dynamic power resulting from the increased area. Moreover, such upsizing of the output logic also increases setup time of enable logic, which is typically an important constraint for any high performance system, e.g., processors and DSP cores.

BRIEF SUMMARY

Various embodiments of the invention add safeguarding circuitry to the conventional CGC architecture that prevents the input node (e.g., pn1 of FIGS. 1 and 2) of the output logic gate from discharging prematurely. In one example embodiment, an additional transistor is placed between the input node of the output logic gate and ground. An inverter, which is in communication with enable circuitry, is placed at the gate of the additional transistor. When the CGC is enabled and is receiving a rising clock edge, the input node of the output logic gate is not discharged. Such an arrangement can prevent failure in the operational mode of the CGC.

In another example, the feedback loop of the conventional CGC architecture is modified so that it does not include the output of the NAND gate, but rather includes an inverted signal taken from the input node of the NAND gate. An additional transistor is added to the feedback loop as well. The new feedback arrangement keeps the input node of the NAND gate from discharging during a slow rising edge. In yet other examples, embodiments add safeguarding circuitry to CGCs based on active high latches as well to prevent premature charging of the input node (e.g., pn1 of FIG. 4.

Various embodiments reduce or eliminate the scope of functional failure, even at lower voltage operations. Some embodiments also suppress large amounts of noise in the internal nodes, which might otherwise induce failures in other neighboring circuits. Other benefits of some embodiments include substantial power savings as well as improved timing. Consequently, some embodiments can operate at a higher global frequency and/or allow a given CGC to drive a larger load.

The foregoing has outlined rather broadly the features and technical advantages of the present invention in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the technology of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following description taken in conjunction with the accompanying drawings.

DETAILED DESCRIPTION

Figure 5:
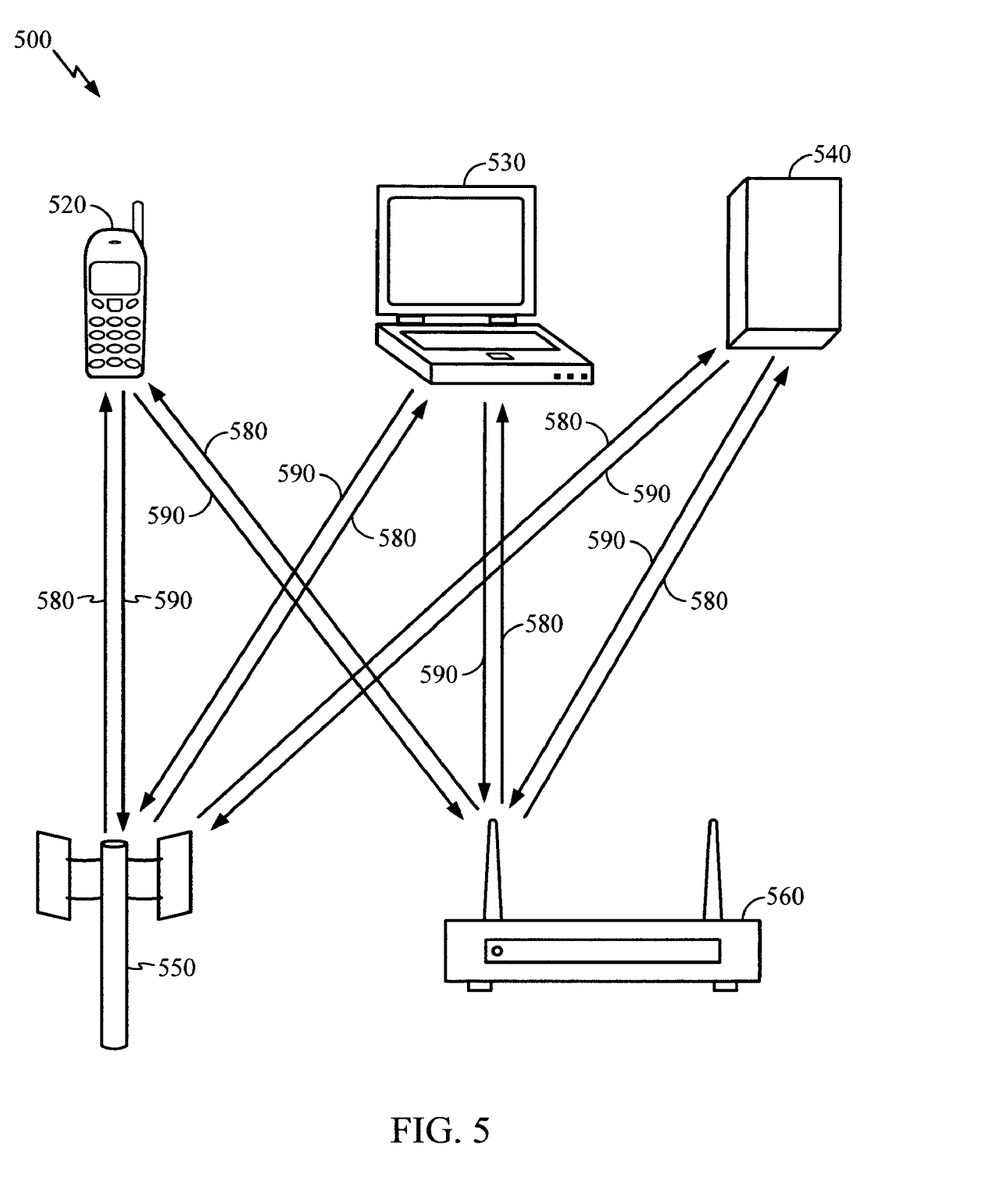
FIG. 5 is a block diagram showing an exemplary wireless communication system in which an embodiment of the invention may be advantageously employed.

FIG. 5 shows an exemplary wireless communication system 500 in which an embodiment of the invention may be advantageously employed. For purposes of illustration, FIG. 5 shows three remote units 520, 530, and 540 and two base stations 550, 560. It will be recognized that conventional wireless communication systems may have many more remote units and base stations. The remote units 520, 530, and 540 can include any of a variety of clock gating cells. The remote units 520, 530, and 540 can also include any of a variety of other components, such as Analog to Digital Converters (ADCs), Digital to Analog Converters (DACs), processors, delta sigma data converters, and the like. Embodiments of the invention can find use in various components, and especially in synchronized circuits, such as processors, DACs, ADCs, and the like. FIG. 5 shows forward link signals 580 from the base stations 550, 560 to the remote units 520, 530, and 540 and reverse link signals 590 from the remote units 520, 530, and 540 to the base stations 550, 560.

Generally, remote units may include cell phones, handheld personal communication systems (PCS) units, portable data units such as personal data assistants, fixed location data units such as meter reading equipment, and/or the like. In FIG. 5, the remote unit 520 is shown as a mobile telephone, the remote unit 530 is shown as a portable computer, and the remote unit 540 is shown as a fixed location remote unit in a wireless local loop system. The base stations 550, 560 can be any of a variety of wireless base stations, including, e.g., cellular telephone base stations, wireless network access points (e.g., IEEE 802.11 compliant access points), and the like. Although FIG. 5 illustrates remote units according to the teachings of the invention, the invention is not limited to these exemplary illustrated units.

Figure 6:
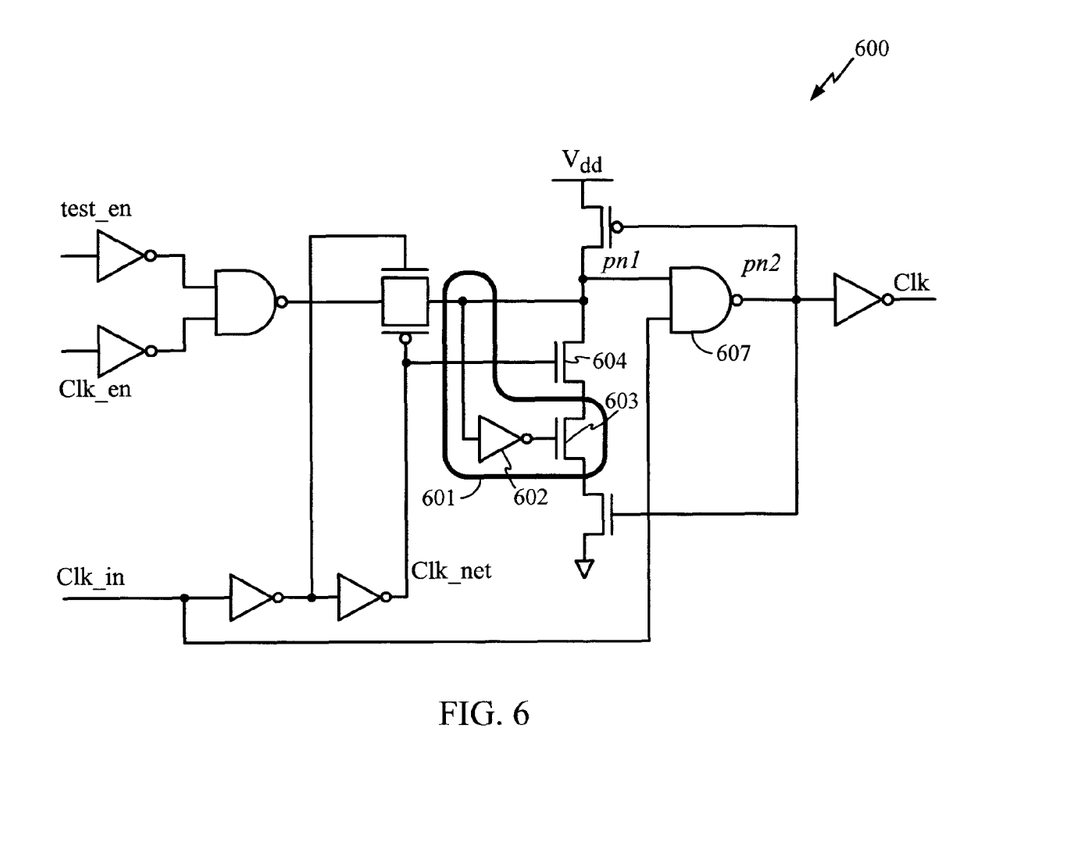
FIG. 6 is an illustration of an exemplary CGC, adapted according to one embodiment of the invention.

FIG. 6 is an illustration of an exemplary CGC 600, adapted according to one embodiment of the invention. The CGC 600 has an architecture similar to that of the CGC 100, but the CGC 600 adds circuitry 601 that prevents the pn1 node from discharging during a slow rising clock edge. The additional circuitry 601 includes a minimum sized inverter 602 driving an NFET 603 in the pull-down stack of the pn1 node. In this example embodiment, "minimum sized" refers to an inverter having a width of about 120 nm; however the scope of embodiments is not so limited, as a given application can employ any suitably sized inverter.

Figure 7:
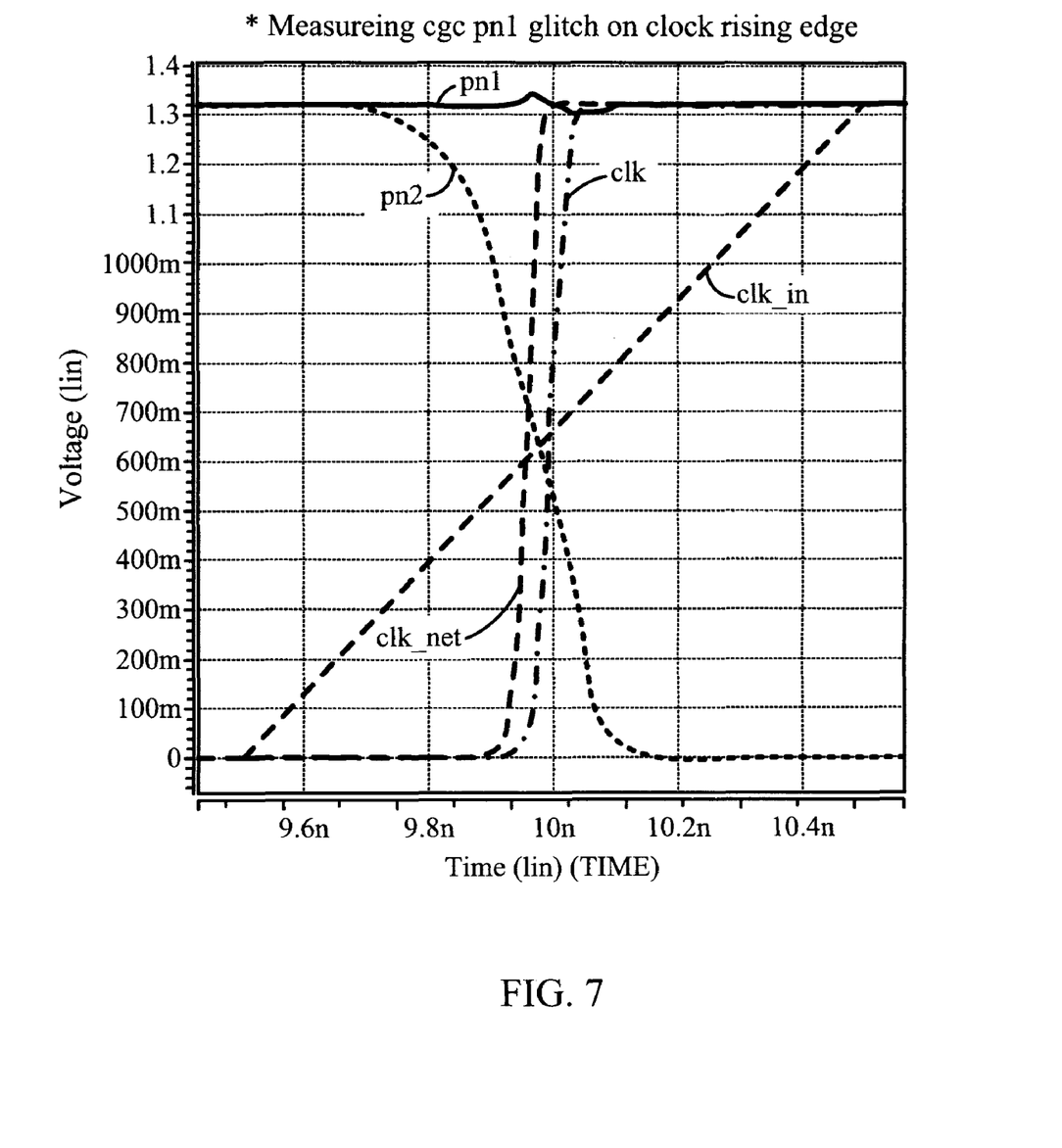
FIG. 7 is a simulated timing diagram for the CGC of FIG. 6, and it shows voltages of the key nodes therein.

FIG. 7 is a simulated timing diagram for the CGC 600 (of FIG. 6), and it shows voltages of the key nodes therein. Initially the pn1 node is set to logic 1 during the transparent phase of the latch. Under this condition the CGC 600 simply passes the input Clk_in signal to the output Clk. Also, initially the Clk_in signal is at logic 0, so the pn2 node is at logic 1.

Even for a slow rising input Clk_in signal, the internally buffered Clk_net node goes high quickly, before Clk_in rises halfway to Vdd/2, and turns on the pull-down NFET 604 of the pn1 node. The inverter 602 and the feedback NFET 603 stop the discharging of the pn1 node when the pn1 node is at logic 1. In other words, when the CGC 600 is enabled, circuitry 601 keeps node pn1 from being discharged. Therefore, the pn1 node does not exhibit premature voltage drop.

One advantage of the embodiment of FIG. 6 is that it allows some downsizing of the output logic gate 607, which reduces the capacitive loading of the Clk_in, thereby reducing the dynamic switching power of the CGC 600 as a whole. By one estimate, the output logic gate 607 can be downsized by up to forty percent. Thus the proposed design also compensates for any increased capacitive loading of the pn1 node that is due to the additional (minimum sized) inverter 602 connection. The design of the CGC 600 helps to reduce functional reliability concerns for low voltage operation, thereby making low voltage operation possible. With low voltage operation available, the power consumption and battery life of a given chip can be effectively enhanced. Furthermore, for the same voltage, various embodiments allow the use of larger fan-out loading, thereby reducing the total number of CGCs in a large system, saving substantial area and power dissipation.

Figure 8:
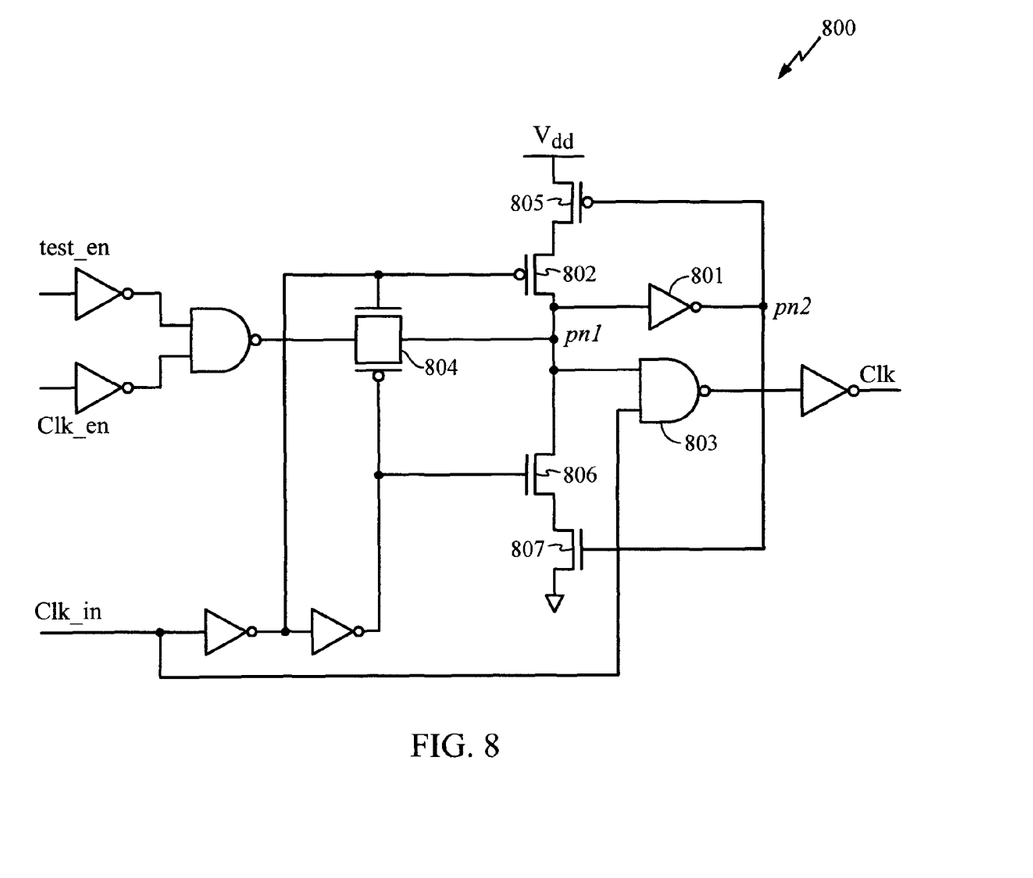
FIG. 8 is an illustration of an exemplary CGC, adapted according to one embodiment of the invention.

FIG. 8 is an illustration of an exemplary CGC 800, adapted according to one embodiment of the invention. The CGC 800 includes an additional PMOS transistor 802 and an inverter 801. The architecture of the CGC 800 also has a feedback loop that includes, among other things, the output from the inverter 801 (in this case, node pn2) and the additional PMOS transistor 802. During the active phase of the latch, Clk_in is at logic 0 and the pn1 node is driven by "en" logic through the transmission gate 804. When Clk_in is at logic 1, the transmission gate 804 is off, and the pn1 node is either driven by the pull-up circuit (which includes devices 802 and 805) or the pull-down circuit (which includes devices 806 and 807). In CGC 800, feedback devices 802 and 807 are each driven by an inverter output rather than by the output of NAND 803.

In the configuration of CGC 800, when Clk_in transitions from logic 0 to logic 1, node pn2 does not change its state as long as the state of node pn1 is maintained. Specifically, inverter 801 and the inverter formed by devices 802 and 805-807 act as a cross-coupled inverter circuit, where one inverter has node pn1 as an input and pn2 as an output, and the other inverter has node pn2 as an input and node pn1 as an output. In the state retention phase of the latch (when Clk_in is at logic 1), the cross-coupled inverters act to preserve the states of nodes pn1 and pn2 preventing premature charge or discharge of node pn1 during the Clk_in transition. In the active phase (when Clk_in is at logic 0) the feedback loop is turned off to allow the data to propagate through the latch, and the states of pn1 and pn2 are not preserved. Similarly to the CGC 600 (of FIG. 6), the CGC 800 allows for use of a downsized output logic gate 803.

Figure 9:
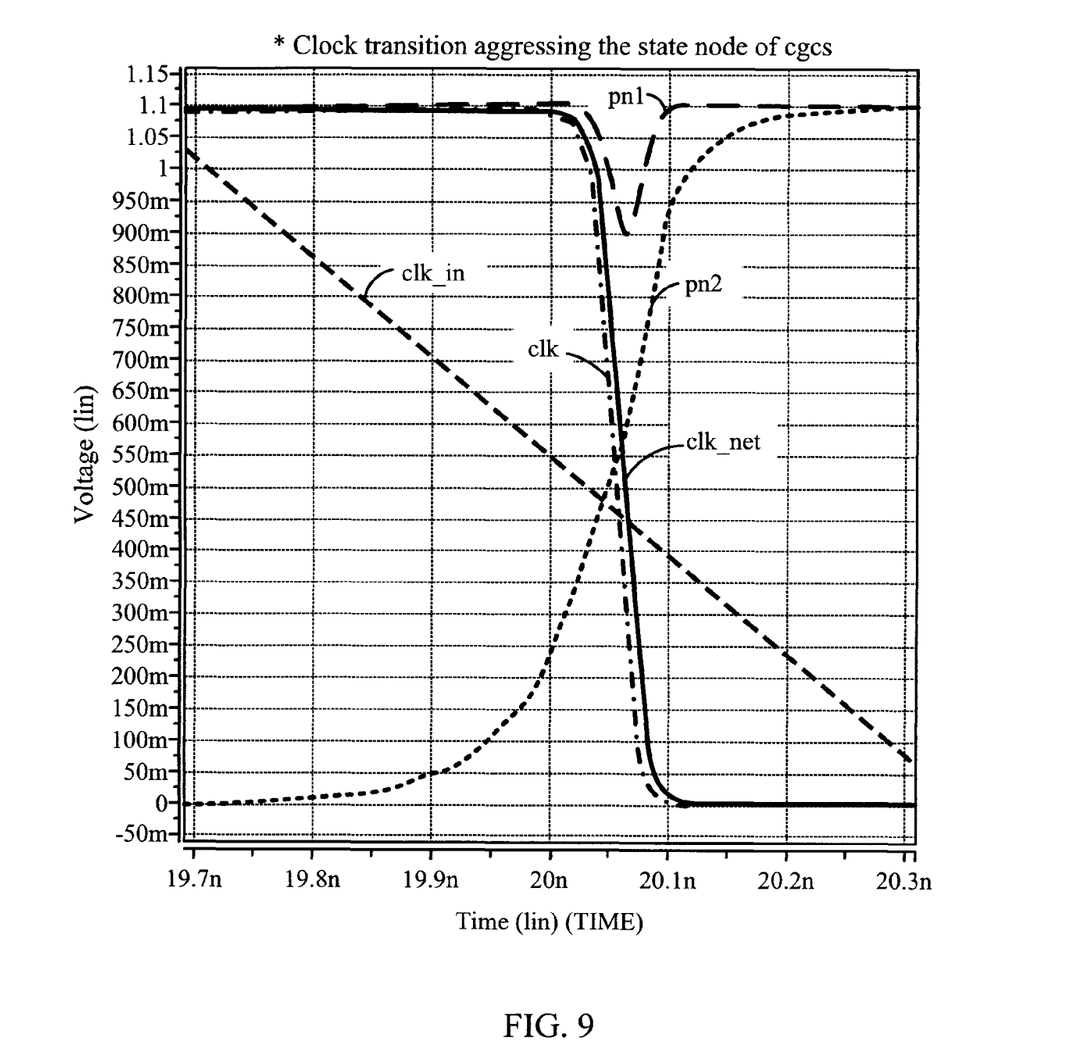
FIG. 9 illustrates a simulated timing diagram of key nodes of the CGC of FIG. 1 during some operations.

The embodiments of FIGS. 6 and 8 also protect against another failure mode that can occur when passing a falling clock edge through the CGC. FIG. 9 is a simulated timing diagram showing the failure mode that can occur in conventional CGCs, such as that shown in FIGS. 1 and 2. FIG. 9 shows that when Clk_in falls with a slow transition rate, Clk_net follows Clk after a short time, and node pn2 changes slowly from logic 0 to logic 1. During the transition, there is a timing window when both the transistors 104 and 106 (FIG. 2) in the pull-down stack are turned on, thereby discharging node pn1. The CGC 600 (of FIG. 6) prevents the discharging of node pn1 by cutting off the discharge path with the additional transistor 603, which remains off during the operation. The CGC 800 (of FIG. 8) prevents the discharging of node pn1 in a similar way by cutting off the discharge path with the inverter 801 driving pull-down device 807 to an off state.

Figure 10:
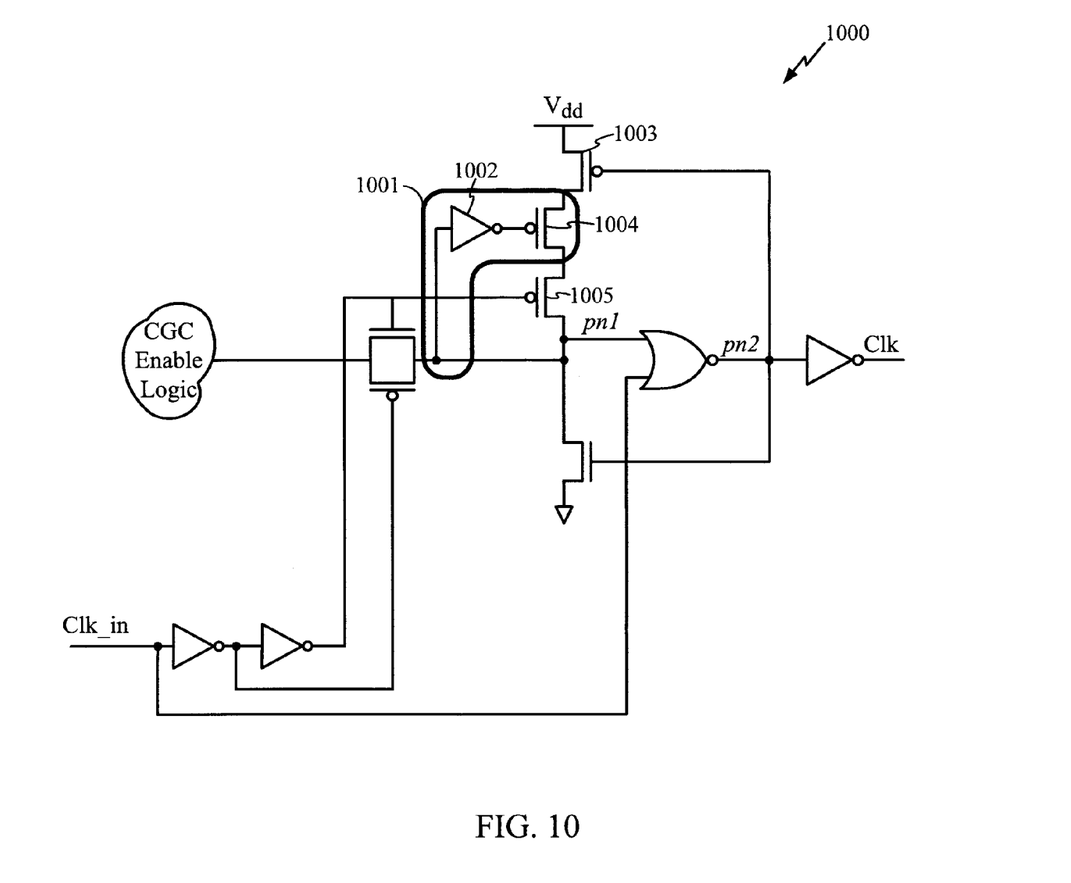
FIG. 10 is an illustration of an exemplary CGC, adapted according to one embodiment of the invention.

The embodiments of FIGS. 6 and 8, described above, include solutions for use in CGCs based on active low latches. The scope of embodiments also includes solutions for use in CGCs based on active high latches, which are typically described as duals of CGCs based on active low latches. FIG. 10 is an illustration of exemplary CGC 1000 adapted according to one embodiment of the invention. System 1000 is an active high latch-based equivalent of the embodiment of FIG. 6. Generally, CGC 1000 prevents transistors 1003 and 1005 from charging node pn1 prematurely. During a falling clock edge, nodes pn1 and pn2 both start at logic 0. When node pn2 is at logic 0, transistor 1003 is on. When Clk_in begins falling, the internally buffered signal at the input to transistor 1005 goes to logic 0 much faster than either node pn1 or pn2, thereby turning on transistor 1005 before nodes pn1 and pn2 change.

Safeguarding circuitry 1001 includes inverter 1002 and transistor 1004. As long as node pn1 remains at logic 0, the output of inverter 1002 is logic 1, which turns off transistor 1004. Since transistor 1004 is in series with transistors 1003 and 1005, node pn1 is not prematurely charged to Vdd during the slow falling clock edge.

It should be noted that for a CGC that is based on an active high latch, such as CGC 1000, its enable logic is typically also a dual of that of a CGC based on an active low latch. For instance, one type of enable logic that can be used in the embodiments shown in FIGS. 10 and 11 includes a NOR gate.

Figure 11:
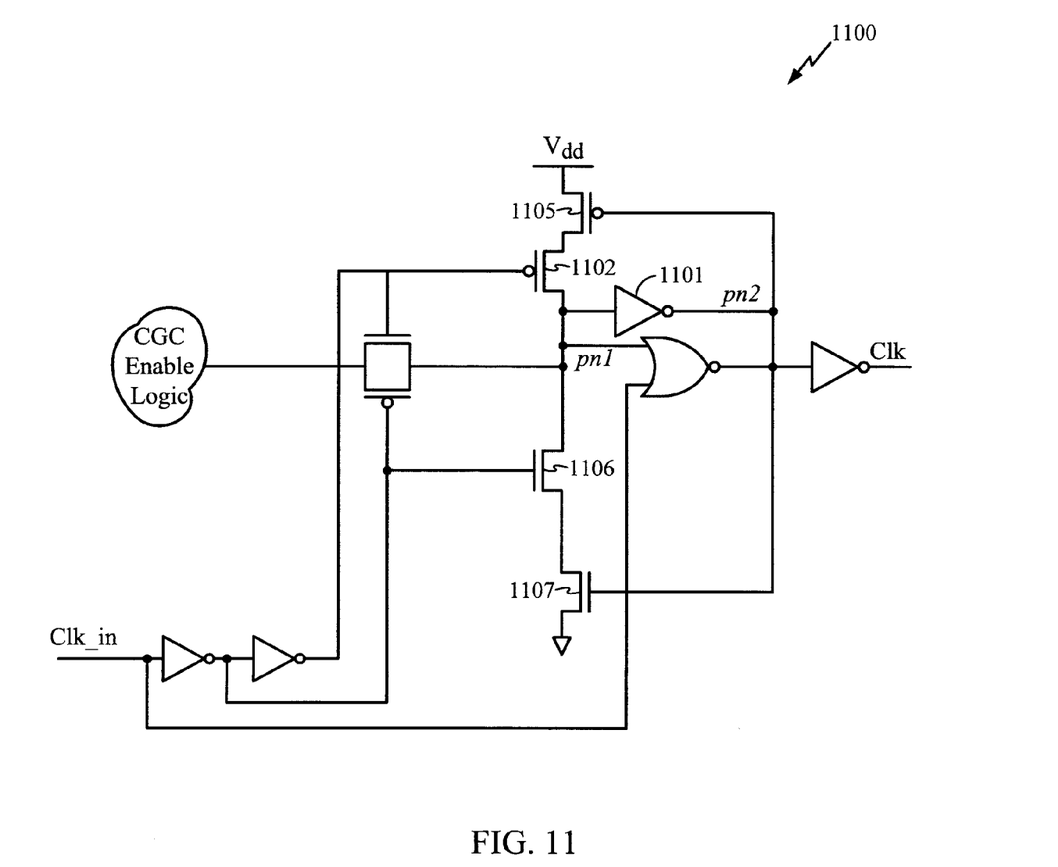
FIG. 11 is an illustration of an exemplary CGC, adapted according to one embodiment of the invention.

FIG. 11 is an illustration of exemplary CGC 1100 adapted according to one embodiment of the invention. System 1100 is an active high latch-based equivalent of the embodiment of FIG. 8. System 1100 uses a cross-coupled inverter structure to preserve the states of nodes pn1 and pn2 when the Clk_in falls from one to zero. When Clk_in transitions from logic 1 to logic 0, node pn2 does not change its state as long as the state of node pn1 is maintained. Specifically, inverter 1101 and the inverter formed by devices 1102 and 1105-1107 act as a cross-coupled inverter circuit. In the state retention phase of the latch (when Clk_in is at logic 0), the cross coupled inverters act to preserve the states of nodes pn1 and pn2. In CGC 1100, the state of node pn1 is preserved by preventing premature charge or discharge during the Clk_in transition. In the active phase (when Clk_in is at logic 1) the feedback loop is turned off because devices 1102 and 1106 are turned off to allow the data to propagate through the latch.

Various embodiments of the invention provide advantages over the prior art. For example, significant power savings can be achieved using the systems of FIGS. 6, 8, 10, and 11 versus the prior art system of FIGS. 1 and 2. The proposed additional circuitry can, in some embodiments, increase the extent of downsizing that can be achieved in the output logic to reduce the capacitive loading of the Clk path. Furthermore, the reduced capacitive loading on the input circuit also can improve the setup time of the enable logic. As setup times decrease, an engineer's options are increased, since higher frequency clocks can be chosen for use in the system.

Figure 12:
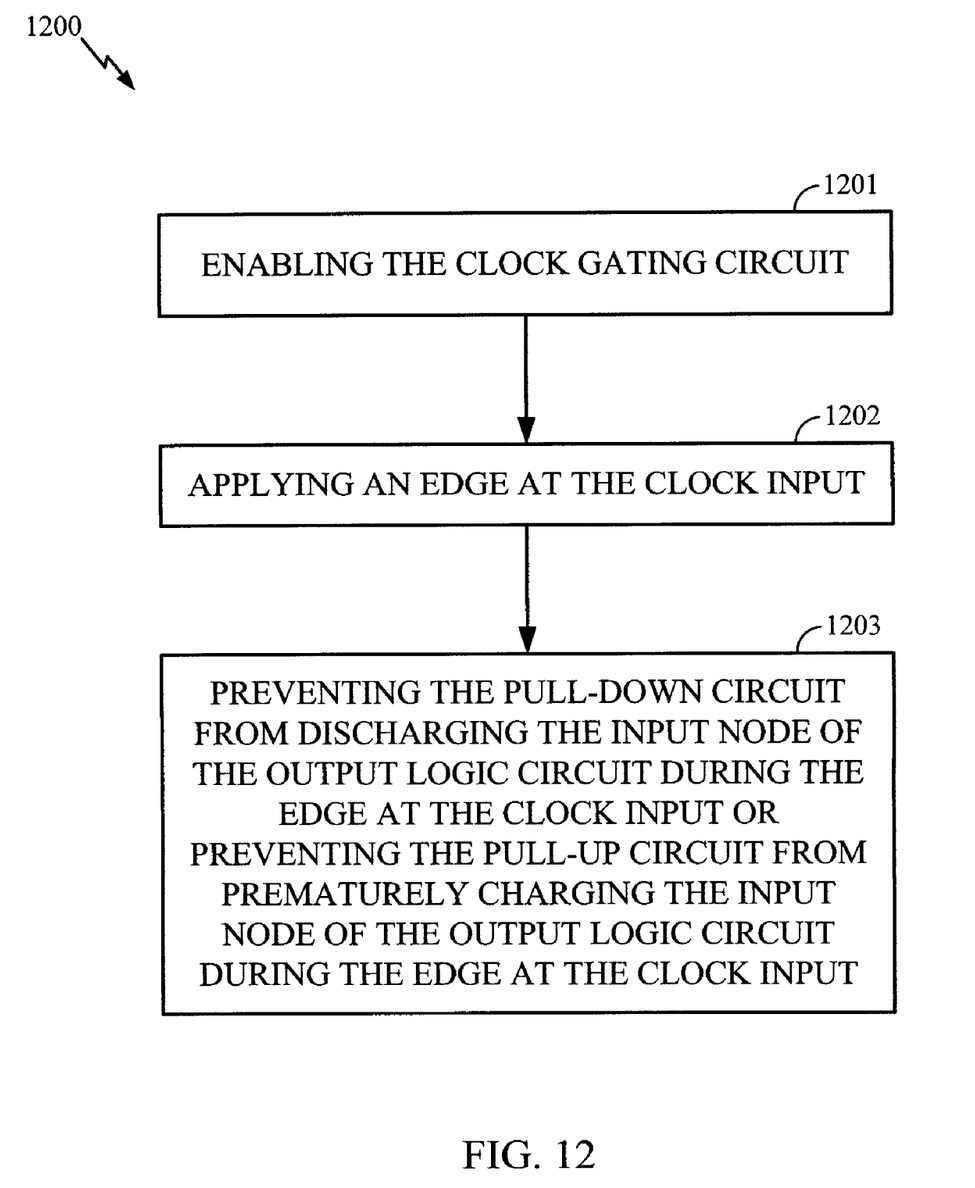
FIG. 12 is an illustration of an exemplary process, adapted according to one embodiment of the invention.

Some embodiments of the invention include methods for use of improved CGCs. In one example, such a method is performed by a chip that includes one or more CGCs, such as the CGC 600 (of FIG. 6) or the CGC 800 (of FIG. 8). FIG. 12 is an illustration of an exemplary process 1200, adapted according to one embodiment of the invention.

In the block 1201, the clock gating cell is enabled by asserting the enable logic. In many embodiments, there are two or more enable inputs, such as a clock enable and a test enable. However, the scope of embodiments is not limited by the number of enable inputs.

In the block 1202, a clock signal with an edge is applied at the clock input. The edge can be a falling edge or a rising edge, and the clock signal will usually include an alternating pattern of rising and falling edges. Since the CGC is enabled, the input clock signal should be propagated through the CGC and into other circuitry.

In the block 1203, safeguarding circuitry prevents the premature discharging or charging of the input node of the output logic circuit during the clock edge. For example, both CGCs of FIGS. 6 and 8 prevent pull-down transistors from prematurely discharging the node pn1, which is one input node of the output NAND gate. Furthermore, the CGCs of FIGS. 10 and 11 prevent pull-up transistors from prematurely charging the node pn1.

While the process 1200 is shown as a series of discrete steps, the scope of embodiments is not so limited. Various embodiments may add, omit, modify, or rearrange one or more blocks. For instance, some embodiments may repeat the blocks 1202-1203 with each clock cycle, or even with each edge of the clock. Moreover, some embodiments include propagating the clock signal to various computational circuits, thereby allowing those computational circuits to be in an operational mode.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

Although the present invention and its advantages have been described in detail, it should be understood that various changes, substitutions and alterations can be made herein without departing from the technology of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A clock gating cell comprising:
   a latch in communication with enable logic and an output logic circuit, wherein the latch includes:
   a first circuit at an input node of the output logic circuit in communication with one or more of system power and ground; and
   safeguarding circuitry preventing premature voltage change of the output logic circuit input node by the first circuit during a clock edge; the safeguarding circuitry comprising an inverter between the output logic circuit input node and the first circuit that is turned off during clock edge.

2. The clock gating cell of claim 1 wherein the first circuit comprises an item selected from the list consisting of:
   a pull-down circuit; and
   a pull-up circuit.

3. The clock gating cell of claim 1 wherein the premature voltage change comprises an item selected from the list consisting of:
   charging; and
   discharging.

4. The clock gating cell of claim 1, wherein the latch comprises an item selected from the list consisting of:
   an active low latch; and
   an active high latch.

5. The clock gating cell of claim 1, wherein the output logic circuit comprises an item selected from the list consisting of:
   an AND gate; and
   an OR gate.

6. The clock gating cell of claim 5, wherein the AND gate includes a NAND gate, the output of which is fed to an inverter.

7. The clock gating cell of claim 5, wherein the OR gate includes a NOR gate, the output of which is fed to an inverter.

8. A clock gating cell comprising:
   a latch in communication with enable logic and an output logic circuit, wherein the latch includes:
   a first circuit at an input node of the output logic circuit in communication with one or more of system power and ground; and
   safeguarding circuitry preventing premature voltage change of the output logic circuit input node by the first circuit during a clock edge, wherein the first circuit is in a feedback loop that includes an input node of the output logic circuit.

9. The clock gating cell of claim 8, wherein the feedback loop includes a cross-coupled inverter structure that preserves the states of the input node of the output logic circuit and a node controlling states of devices in the first circuit.

10. A clock gating cell comprising:
    a latch in communication with enable logic and an output logic circuit, wherein the latch includes:
    a first circuit at an input node of the output logic circuit in communication with one or more system power and ground; and
    safeguarding circuitry preventing premature voltage change of the output logic circuit input node by the first circuit during a clock edge, and a clock input followed by one or more inverters that propagate a clock input signal to a controlling terminal of a transistor in the first circuit, wherein a voltage at the controlling terminal of the transistor changes to a logic value that turns the transistor on before the clock input signal reaches a level of Vdd/2, where Vdd is a system voltage for the clock gating cell.

11. A method for operating a clock gating cell that includes an enable control logic input, a clock input, an output logic gate, a first circuit at an input node of the output logic gate and in communication with one or more of system power and ground, and a safeguarding circuit in communication with the first circuit, the method comprising:
    enabling the clock gating cell using the enable control logic;
    applying a clock input signal with an edge at the clock input; and
    using the safeguarding circuit to prevent the first circuit from prematurely changing the voltage level of the input node of the output logic gate during the edge of the clock input signal, the safeguarding circuit preventing the first circuit from prematurely charging the input node of the output logic gate.

12. The method of claim 11 wherein the safeguarding circuit prevents the first circuit from prematurely discharging the input node of the output logic gate.

13. The method of claim 11 further comprising:
    propagating the clock signal from the clock gating cell to one or more computational circuits.

14. The method of claim 11 wherein applying a clock input signal comprises:
    applying at the clock input a signal including alternating rising and falling edges.

15. A clock gating cell comprising:
    a latch in communication with enable logic;
    a clock input in communication with the latch and with a first input node of an output logic circuit, the output logic circuit including a second input node in communication with a first circuit in the latch, the first circuit in communication with one or more of system power and ground; and
    a safeguarding circuit in communication with the second input node preventing the first circuit from prematurely changing a voltage level of the second input node during an edge of a clock signal, the clock signal received at the clock input, the safeguarding circuit comprising an inverter arranged such that the input of the inverter is at the second input node, and an output of the inverter is at a controlling terminal of a transistor in the first circuit.

16. The clock gating cell of claim 15 wherein the safeguarding circuit prevents the first circuit from prematurely discharging the second input node.

17. The clock gating cell of claim 15 wherein an output of the output logic circuit is in a feedback loop with a pull-down or pull-up circuit.

18. The clock gating cell of claim 15 wherein the output logic circuit propagates an inverted clock signal when the enable logic enables the clock gating cell.

19. The clock gating cell of claim 15 wherein the output logic circuit comprises a NAND gate, the clock gating cell further comprising an inverter following the NAND gate.

20. The clock gating cell of claim 15 wherein the output logic circuit comprises a NOR gate, the clock gating cell further comprising an inverter following the NOR gate.

21. The clock gating cell of claim 15 wherein the first circuit comprises:
    a series of transistors in communication with ground and system power, the second input node arranged within the series of transistors.

22. A clock gating cell comprising:
a latch in communication with enable logic;
a clock input in communication with the latch and with a first input node of an output logic circuit, the output logic circuit including a second input node in communication with a first circuit in the latch, the first circuit in communication with one or more of system power and ground; and
a safeguarding circuit in communication with the second input node preventing the first circuit from prematurely changing a voltage level of the second input node during an edge of a clock signal, the clock signal received at the clock input, the safeguarding circuit preventing the first circuit from prematurely charging the second input node.

23. A clock gating cell comprising:
a latch in communication with enable logic;
a clock input in communication with the latch and with a first input node of an output logic circuit, the output logic circuit including a second input node in communication with a first circuit in the latch, the first circuit in communication with one or more of system power and ground; and
a safeguarding circuit in communication with the second input node preventing the first circuit from prematurely changing a voltage level of the second input node during an edge of a clock signal, the clock signal received at the clock input, wherein the second input node feeds an inverter, the output of the inverter controlling one or more transistors in the first circuit, and wherein the inverter and the first circuit form a cross-coupled inverter structure that preserves a state of the second input node during the edge of the clock signal.

* * * * *